United States Patent [19]

Miyazawa et al.

[11] Patent Number: 4,799,229
[45] Date of Patent: Jan. 17, 1989

[54] SEMICONDUCTOR LASER ARRAY

[75] Inventors: Seiichi Miyazawa, Sagamihara; Toshitami Hara, Tokyo; Hidetoshi Nojiri, Isehara; Yoshinobu Sekiguchi, Yamato; Mitsutoshi Hasegawa, Yokohama; Sotomitsu Ikeda, Atsugi, all of Japan

[73] Assignee: Canon Kabushiki Kaisha, Tokyo, Japan

[21] Appl. No.: 49,165

[22] Filed: May 13, 1987

[30] Foreign Application Priority Data

May 15, 1986 [JP] Japan ................................ 61-112202
May 19, 1986 [JP] Japan ................................ 61-114003
May 19, 1986 [JP] Japan ................................ 61-114009
May 19, 1986 [JP] Japan ................................ 61-114010

[51] Int. Cl.$^4$ .............................................. H01S 3/19
[52] U.S. Cl. ........................................ 372/50; 372/45; 372/46; 357/17
[58] Field of Search .................... 372/50, 43, 44, 45, 372/46; 357/17

[56] References Cited

U.S. PATENT DOCUMENTS

| 4,185,252 | 1/1980 | Scifres et al. | 372/46 |
| 4,309,667 | 1/1982 | Di Forte et al. | 372/45 |
| 4,571,021 | 2/1986 | Minoura et al. | 350/6.8 |
| 4,603,421 | 7/1986 | Scifres et al. | 372/50 |
| 4,627,062 | 12/1986 | Bender | 372/36 |
| 4,631,729 | 12/1986 | Goodwin et al. | 372/44 |

FOREIGN PATENT DOCUMENTS 18-28904 12/1943 Japan .
55-30870 3/1980 Japan .
60-154694 8/1985 Japan .

Primary Examiner—William L. Sikes
Assistant Examiner—Georgia Y. Epps
Attorney, Agent, or Firm—Fitzpatrick, Cella, Harper & Scinto

[57] ABSTRACT

A semiconductor laser array includes plural semiconductor laser elements each emitting light from two end faces constituting resonant planes and monolithically formed on a semiconductor substrate, in which the mutual angle of the beams emerging from one end of semiconductor lasers is different from that from the other end and in which the beam angle is selected as a non-zero finite value at least one end.

8 Claims, 6 Drawing Sheets

SEMICONDUCTOR LASER ARRAY

BACKGROUND OF THE INVENTION

1. Field of the Invention

The present invention relates to a semiconductor laser array provided with plural semiconductor laser elements monolithically formed on a semiconductor substrate. The semiconductor laser array of the present invention is particularly suitable for use as a light source in a multiple-beam scanning apparatus in which a recording member is scanned with plural beams for information recording, etc.

2. Related Background Art

As disclosed, for example in U.S. Pat. No. 4,571,021, when designing a light scanning apparatus by the use of a plurality of beam emitting devices such as laser diodes (LDs) or light-emitting diodes (LEDs), there has heretofore been known a method which comprises disposing the beam emitting devices so that the directions of emission of the lights from the beam emitting devices intersect one another at a point Po as shown in FIG. 1 of the accompanying drawings, and scanning a plurality of scanning spots relative, to a surface to be scanned while keeping a good image state.

FIG. 1 of the accompanying drawings shows a typical example of the prior art and is a view of the optical system between a light source and a deflector as seen from a direction perpendicular to a deflecting scanning plane. In FIG. 1, reference characters 71a and 71b designate beam emitting devices each comprising a laser diode. The devices 71a and 71b are disposed on a mount 72 as if the central rays ha and hb of the lights emitted from the devices 71a and 71b passed through the same point Po. In other words, if normals are drawn to the beam emitting surfaces of the respective devices, the normals are set so as to intersect each other at the point Po. Further, if seen from a direction parallel to the deflecting-scanning plane, the position at which the central rays ha and hb pass through the point Po is set so as to slightly deviate in a direction orthogonal to the deflecting-scanning plane. Also, said point Po and a point P near the deflecting-reflecting surface 73 of the deflector are kept in an optically conjugate relation by an imaging lens 74.

On the other hand, to obtain an effect similar to that shown in FIG. 1 where a monolithically formed laser diode array or the like is used as a light source, it is necessary to provide some optical system between the light source and the deflector. In the example disclosed in U.S. Pat. No. 4,565,421, a prism is disposed in front of a laser diode array. This is shown in FIG. 2 of the accompanying drawings.

FIG. 2 shows the cross-section of the prism in a case where the laser diode array has five light-emitting elements. In FIG. 2, reference numeral 81 designates the laser diode array having five light-emitting elements 81a, 81b, 81c, 81d and 81e, and reference numeral 82 denotes the prism. The central ray ha of the light beam from the light-emitting element 81a is refracted by an inclined surface 82a and bent as if it passed through the point Po. The central ray hb from the light-emitting element 81b, the central ray hd from the light-emitting element 81d and the central ray he from the light-emitting element 81e are bent by inclined surfaces 82b, 82d and 82e, respectively, as if they passed through the point Po. The central ray hc from the light-emitting element 81c passes perpendicularly through a flat surface 82c, and the point Po exists on the extension of this central ray hc. In this manner, there are provided inclined flat surfaces having their angles of inclination determined correspondingly to the respective light-emitting elements, and the central rays of the light beams after having emerged from the prism 82 have their directions controlled as if they were emitted from the point Po. This point Po, as previously described, is kept conjugate with a desired point P (not shown) near the deflecting-reflecting surface through an optical system.

On the other hand, FIG. 3 of the accompanying drawings shows an arrangement for providing a similar effect by a relay optical system 93. In FIG. 3, the relay system 93 is interposed between a collimator lens 92 for collimating and imaging lights emitted from the light-emitting elements 91a and 91b of a laser diode array and a cylindrical lens 95 to image the lights on the reflecting surface 94 of a rotational polygon mirror, and the lights are imaged on a surface to be scanned (not shown) in a good image state.

The problem in this case is the length of the optical path, that is, the length of the optical path of the relay system itself is longer by about 20 cm.

On the other hand, in order to resolve the above-mentioned drawbacks, the present applicant already proposed, in the U.S. application Ser. No. 797,492 (Filed on Nov. 13, 1985, still pending), a semiconductor laser array in which plural semiconductor lasers are formed as a monolithic array with respectively different light emitting directions.

FIG. 4 illustrates such as array, provided with respective semiconductor lasers 11-15, in which 11a-15a are current injection areas, namely light-emitting areas of said semiconductor lasers. Injection areas 11a-15a are formed in such a manner that the extensions thereof (hereinafter called resonant directions) 11b-15b respectively form angles $\phi a$, $\phi b$, $\phi c$, $\phi d$ and $\phi e$ with a perpendicular line 18 to resonant planes 16, 17.

The light oscillated between the planes 16, 17 is bent approximately according to the Snell's law, as indicated by 11c-15c, when emerging through the plane 16 as a laser beam. Similarly the beams emerging from the plane 17 are emitted in directions respectively parallel to said directions 11c-15c. Consequently, in each semiconductor laser, the mutual angle of emerging light beams at one end of the array is same as that at the other end.

In such a semiconductor laser array with slanted beam emitting angles, the angles of the semiconductor lasers have to be large, and the design of the array becomes limited when the injection areas mutually cross as shown in FIG. 5 since the pitch of the lasers becomes smaller. More specifically the length Lc of the cavity requires a certain dimension for laser oscillation and is usually selected in the vicinity of 300 $\mu$m. Thus, for a pitch of 20 $\mu$m, the injection areas inevitably cross if the mutual angle of the injection areas is 3°-4° or larger.

SUMMARY OF THE INVENTION

An object of the present invention is to provide a semiconductor laser array of a beam scanning apparatus housing a short optical path length without additional optical systems. Another object of the present invention is to increase the freedom in designing the already proposed laser array explained above.

The above-mentioned objects can be achieved, according to the present invention, by a semiconductor laser array comprising plural semiconductor laser elements each emitting light from two end faces constituting resonant planes and monolithically formed on a same semiconductor substrate, in which the mutual angle of the beams emerging from one end of semiconductor lasers is different from that from the other end and in which the beam angle is selected as a non-zero finite value at least at one end.

DETAILED DESCRIPTION OF THE PREFERRED EMBODIMENTS

Now the present invention will be clarified in the details by embodiments thereof shown in the attached drawings.

Figure 6:
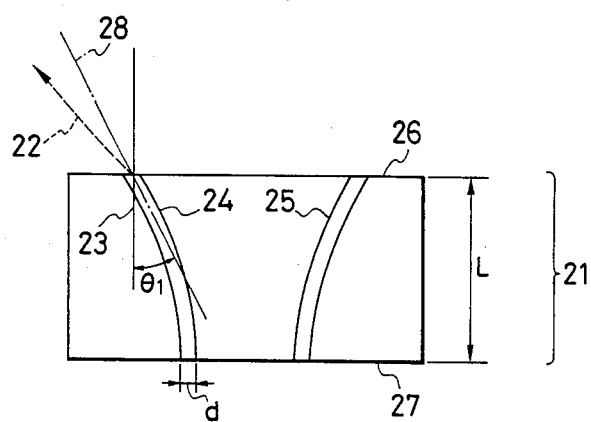
FIG. 6 is a schematic plan view of an embodiment of the semiconductor laser array of the present invention.

FIG. 6 is a schematic plan view of an embodiment of the semiconductor laser array of the present invention, wherein a semiconductor laser array 21 is provided with two semiconductor laser elements monolithically formed on a same semiconductor substrate. Stripe areas 24, 25 of the semiconductor lasers serve to concentrate the electric current, injected into the active layer of the light-emitting layers of said lasers, into said stripe areas by a structure to be explained later. The stripe areas also function to confine the light, generated in the light-emitting layers, in said stripe areas. The light thus confined is transmitted along the stripe area, causing laser oscillation between mirror planes 26, 27 provided at both ends of the semiconductor laser, and is emitted as laser beams from mirror planes 26, 27. In this manner mirror planes 26, 27 constitute an oscillator.

The tangential direction 28 of the stripe area 24 at the mirror plane 26 forms an angle $\theta_1$ ($\neq 0$) with a perpendicular line 23 to the mirror plane 26, so that a laser beam 22 emerging from said mirror plane 26 is emitted into a direction of an angle $\phi_1$ to the perpendicular line 23, according to the Snell's law. Thus, there stands a relationship:

$$n \sin\theta_1 = n_0 \sin\phi_1 \quad (1)$$

wherein n is the refractive index of the light-emitting layer of the semiconductor laser, and $n_0$ is the refractive index of air. Similarly the tangential direction of the stripe area 24 at the mirror plane 27 forms an angle $\theta_2$ to the perpendicular line to mirror plane 27, and the laser beam emitted from mirror plane 27 is directed at an angle $\phi_2$ to the perpendicular line. Since the stripe area 24 is curved, $\theta_1 \neq \theta_2$ ($\phi_1 \neq \phi_2$). $\theta_2$ (or $\phi_2$) may be selected as zero. The stripe area 25 is formed to be symmetrical to the stripe area 24, so that the laser beam emerging from the mirror plane 26 is inclined by an angle $\phi_1$ to the perpendicular line 23 but in opposite direction to the laser beam 22. Consequently two laser beams emerging from the mirror plane 26 of this semiconductor laser array are mutually inclined by an angle $2\phi_1$. Similarly the two laser beams emerging from the mirror plane 27 are mutually inclined by an angle $2\phi_2$.

Figure 4:
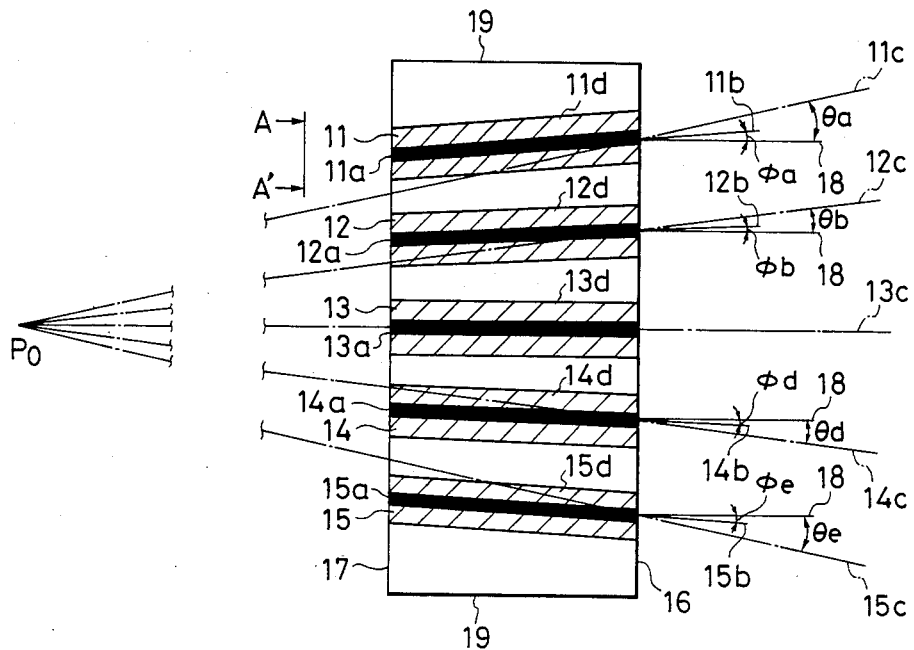
FIGS. 4 and 5 are schematic plan views of an already disclosed semiconductor laser array emitting plural beams in different directions.
Figure 5:
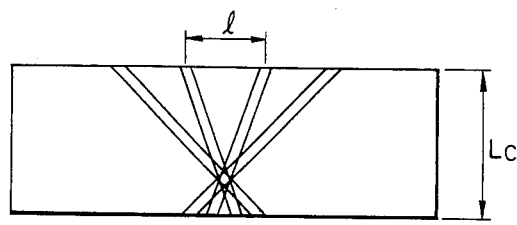

Such a semiconductor laser array 21 allows the construction of a beam scanning apparatus of a short optical path length without additional optical systems, in a similar manner as shown in FIG. 4. Also the mutual angle of the beams from the semiconductor lasers at an end of the array is different from that at the other end, so that the crossing of the stripe areas as shown in FIG. 5 does not occur even when the pitch of the stripe area 24, 25 is made smaller and the beam angle from the mirror plane 26 is selected to be larger.

Figure 1:
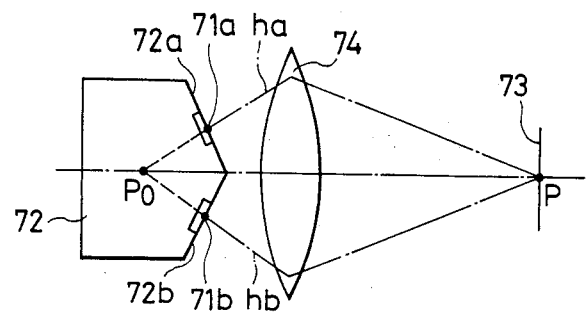
FIGS. 1 to 3 are schematic views of conventional multi-beam emitting apparatus.
Figure 2:
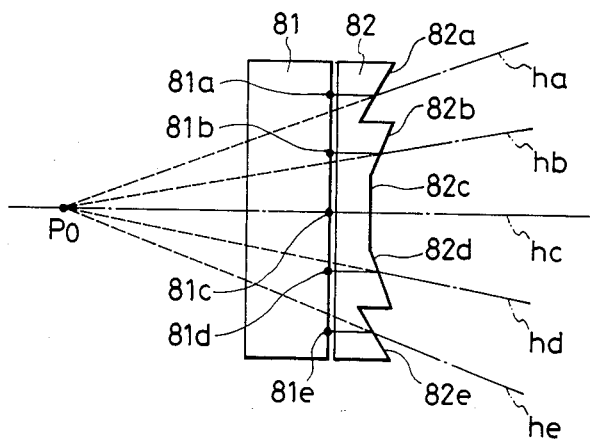
Figure 3:
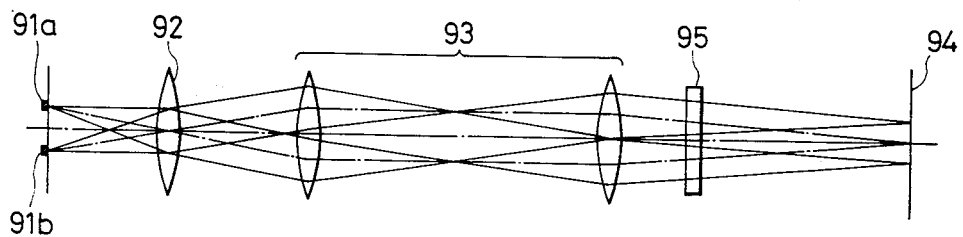

In the semiconductor laser array shown in FIG. 1, the angle $\theta_1$ is arbitrarily selectable, but it is preferably selected within a predetermined range in order to achieve stable and efficient oscillation in the lateral mode, as will be explained further in the following description.

Figure 7:
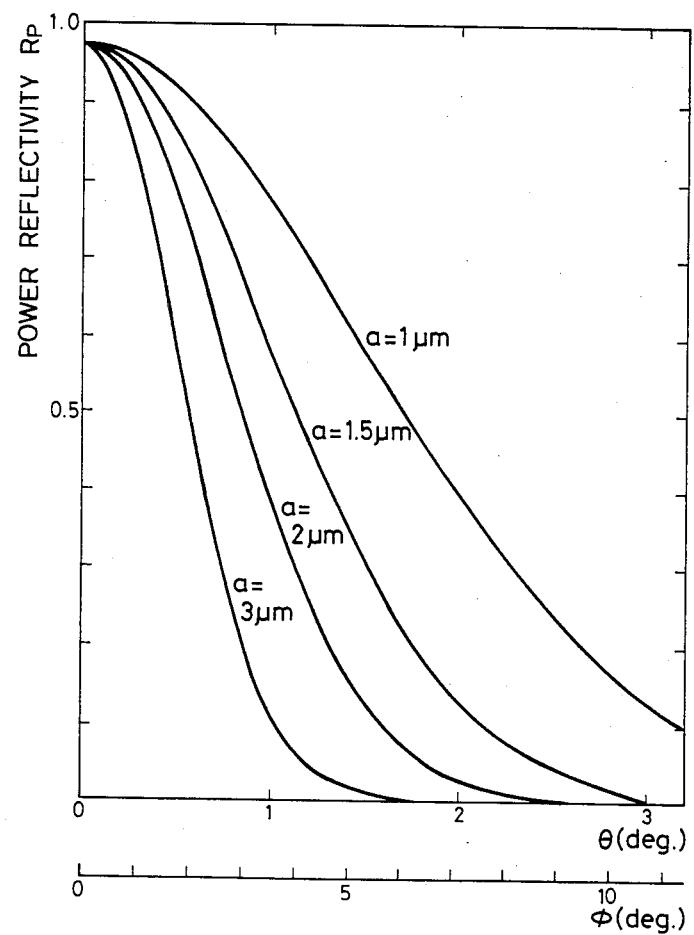
FIG. 7 is a chart showing the relationship between the beam emitting angle from a resonant plane of a semiconductor laser and the reflectance of said plane.
Figure 8:
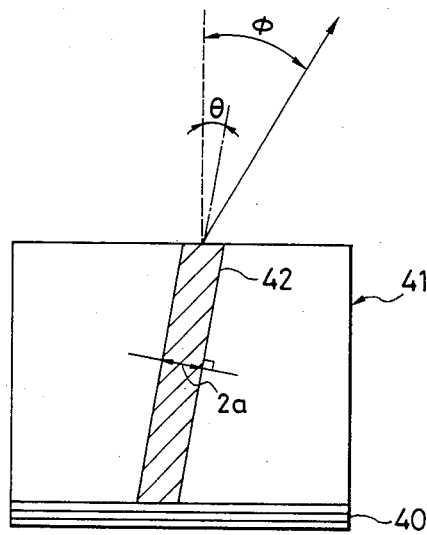
FIG. 8 is a schematic plan view showing the structure of a semiconductor laser employed in the measurement of the relationship shown in FIG. 7.

FIG. 7 is a chart showing the relationship between the angle $\theta$ of the tangential direction of the stripe area at a resonant plane to the perpendicular direction to the resonant plane and the power reflectance Rp at the plane. The relationship was measured, as shown in FIG. 8, with a ridge-structure semiconductor laser 41 with a GaAs active layer, in which $(SiO_2-Si)^2$ $\lambda/4$ layers 40 were formed by vacuum evaporation on the rear resonant plane and the measurement was conducted on the front resonant plane. The curves in FIG. 7 indicate results when the width 2a of the stripe area perpendicular to the longitudinal direction is varied. A relation $2a > 3$ $\mu$m, or a $\leq 1.5$ $\mu$m, is generally preferred for stabilizing the lateral mode and for reducing the threshold current.

As will be apparent from FIG. 7, from the measurements Rp is sufficiently large in a range $|\theta| < 1°$, but it rapidly decreases in a range $|\theta| \geq 1°$, accompanied by a significant increase in the threshold current and a significant loss in the external quantum efficiency.

On the other hand, for an excessively small angle of $\theta$, the laser beam does not stably emerge from the resonant plane diagonally, so that the lateral mode becomes unstable and the current-optical output characteristic curve tends to show a steep bend. The observation of these behaviors has lead to a preferred condition:

$$|\theta| \geq \left(90° - \tan^{-1}\frac{L}{d}\right) \quad (2)$$

wherein d is the width of the stripe area parallel to the resonant plane, and L is the distance between the resonant planes. For example $\theta \geq 0.57°$ for L=300 $\mu$m and d=3 $\mu$m.

Based on these results, the angle $\theta$ should preferably satisfy the following relation:

$$\left(90° - \tan^{-1}\frac{L}{d}\right) \leq |\theta| < 1° \quad (3)$$

in order to stably oscillate a laser with a low threshold value and a high efficiency. Consequently the angle $\theta_1$ in the embodiment shown in FIG. 6 should preferably determined so as to satisfy the relation (3). Also the aforementioned angle $\theta_2$ is selected to be smaller than the angle $\theta_1$ and preferably as small as possible in order to increase the power reflectance at the rear resonance plane. In this manner a semiconductor laser of lowest threshold value and highest efficiency can be obtained at $\theta_2=0$.

Figure 9:
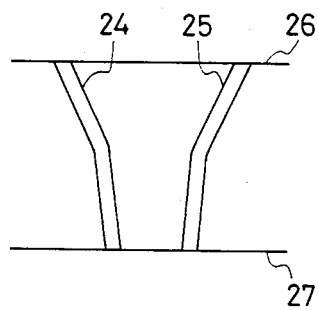
FIGS. 9 to 11 are schematic plan views showing other embodiments of the semiconductor laser array of the present invention.
Figure 10:
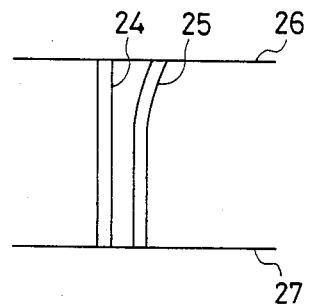
Figure 11:
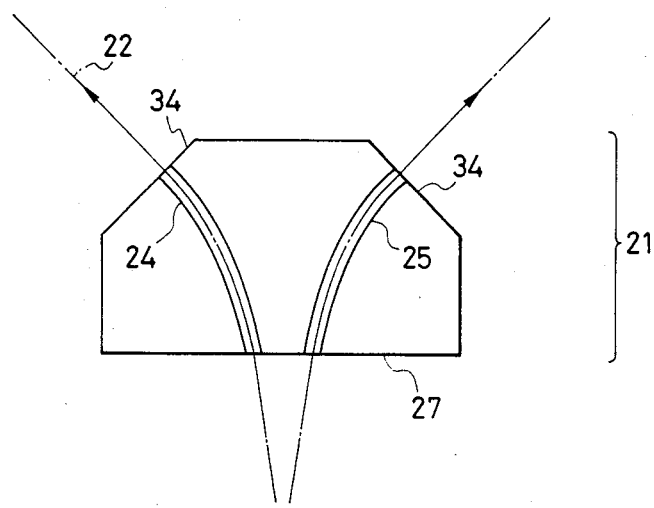

The stripe areas 24, 25 in the embodiment shown in FIG. 6 are of curved form, but they may also be formed in bent linear form as shown in FIG. 9. Also as shown in FIG. 10, it is possible to form a stripe area 24 in a shape linear and the other stripe area 25 in a curve shaped. In the foregoing embodiments the resonant planes 26, 27 are formed mutually parallel by cleavage, but, as shown in FIG. 11, the resonant planes 34 may be formed perpendicular to the longitudinal direction of the stripe areas 24, 25. In such a structure it is no longer necessary to consider the angle between the stripe area and the resonant plane, so that the mutual angle of the laser beams can be further increased. In the semiconductor laser array shown in FIG. 11, the plane 27 can be formed by cleavage as in the foregoing embodiments, but the planes 34 can be formed for example by dry etching. In FIGS. 9 to 11, the same components as those in FIG. 6 are represented by the same reference numbers and will not be explained further.

In the following there will be explained the formation of the above-explained stripe areas.

Figure 12:
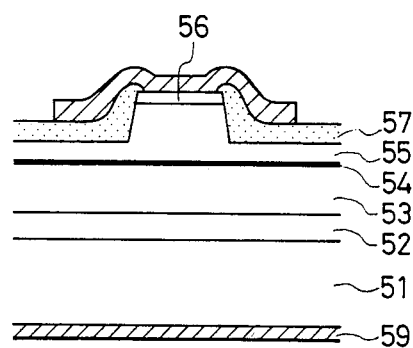
FIGS. 12 to 16 are schematic cross-sectional views showing embodiments stripe-shaped current injection areas in the semiconductor laser array of the present invention.

FIG. 12 is a schematic cross-sectional view of the semiconductor laser array of the present invention, cut across the stripe area, wherein a central convex portion constitutes the stripe area. It is to be understood that only one stripe area is illustrated. The illustrated structure was formed according to the following process.

At first, on an n-type GaAs substrate 51, there were formed an n-type GaAs buffer layer 52 of a thickness of 1 $\mu$m and an n-type Al$_{0.4}$Ga$_{0.6}$As clad layer 53 of a thickness of 2 $\mu$m. Then a non-doped GaAs layer of a thickness of 100 Å and an Al$_{0.2}$Ga$_{0.8}$As layer of a thickness of 30 Å were alternately developed four times, and finally a GaAs layer of a thickness of 100 Å was formed on top to form an active area of multiple quantum well structure. Subsequently developed were a p-type Al$_{0.4}$Ga$_{0.6}$As clad layer 55 of a thickness of 1.5 $\mu$m and a GaAs cap layer 56 of a thickness of 0.5 $\mu$m. All these layers were formed by molecular beam epitaxy method.

Then, in order to limit the current injection area, etching was conducted to a position 0.4 $\mu$m in front of the active layer 54 as shown in FIG. 12, and a silicon nitride layer 57 was formed by plasma CVD and etched only in the ridge top portion to obtain the injection area.

Two stripes were formed in curved state as shown in FIG. 6, with a width of 3 $\mu$m for each injection area.

Subsequently two independent upper electrodes were formed by forming an Cr-Au ohmic layer and separating the layer by etching.

The GaAs substrate 51 was lapped to a thickness of 100 $\mu$m, and n-type Au-Ge ohmic electrode was formed by vacuum evaporation.

After a thermal treatment for diffusion, the planes 26, 27 shown in FIG. 6 were formed by cleavage. The lateral faces of the array were separated by scribing. The pitch of the laser was 100 $\mu$m on the plane 26. Each electrode was connected to the outside by unrepresented wire bonding. The length of cavity, or the distance between the planes 26 and 27, was 300 $\mu$m.

It was found that molecular beam epitaxy (MBE) or metal-organic chemical vapor deposition (MOCVD) was suitable for obtaining ultra-thin layer structure uniformly and reproducibly in the crystal growth, and that a semiconductor laser with super-lattice structure obtained with such methods was suitable for obtaining plural lasers with slanted beam emission.

A similarly satisfactory light emitting efficiency was also obtained by a mono quantum well structure composed of an n-type Al$_{0.4}$Ga$_{0.6}$As layer of 2 $\mu$m, an n-type Al$_{0.2}$Ga$_{0.8}$As layer of 2000 Å, a non-doped GaAs layer of 80 Å, a p-type Al$_{0.2}$Ga$_{0.8}$As layer of 2000 Å and a p-type Al$_{0.4}$Ga$_{0.6}$As layer of 1.5 $\mu$m as the constructions of the viewing of the active layer.

Furthermore a similarly satisfactory result was obtained in a graded index structure in which the Al content on both sides of the non-doped GaAs layer of a thickness of 80 Å was gradually changed from 0.2 to 0.4.

Also a further improved result was obtained by placing several super-lattices of GaAs of a thickness of about 50 Å at an interval of 100 Å in the n-type Al$_{0.4}$Ga$_{0.6}$As clad layer.

Figure 13:
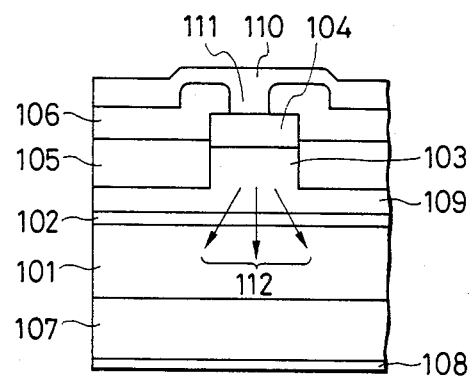
Figure 14:
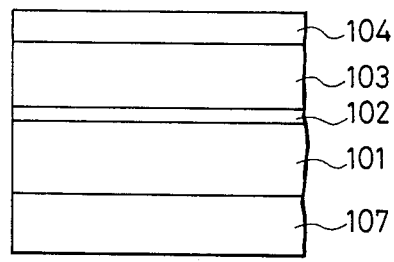

FIG. 13 is a schematic cross-sectional view showing another embodiment of the stripe area, in which 107 indicates an n-GaAs substrate. On the substrate there is at first formed an n-Al$_{0.3}$Ga$_{0.7}$As clad layer 101 of a thickness of 1.5 $\mu$m, and then formed is a non-doped GaAs active layer 102 of a thickness of 0.1 $\mu$m, whereby the carriers and the light are concentrated into active layer 102 by means of clad layer 101. On active layer 102 there are formed a p-Al$_{0.3}$Ga$_{0.7}$As clad layer 103 of a thickness of 1.5 $\mu$m and a p-GaAs cap layer 104 of a thickness of 0.5 $\mu$m. FIG. 14 shows the state after the formation of above-mentioned layers. Subsequently conducted is the ridge formation, as shown in FIG. 13. Outside the ridge the p-Al$_{0.3}$Ga$_{0.7}$As clad layer 103 becomes thinner as indicated by 109, of which thickness is generally in a range from 0.05 to 0.8 $\mu$m and preferably in a range from 0.2 to 0.5 $\mu$m. The layer should be as thin as possible without affecting the active layer 102, since the carrier confining effect is deteriorated at a larger thickness. The width of the ridge should not preferably exceed 10 $\mu$m.

After said ridge formation, an n-Al$_{0.3}$Ga$_{0.7}$As embedded layer 105 is formed with a thickness not burying the ridge. Subsequently formed are an insulating layer 106 and a current injection area 111 by a usual photographic process. Then formed are p- and n-electrodes 110, 108 for example of Au-Zn or Au-Ge-Ni.

A laser formed in this manner can achieve a low threshold current since the current 112 is limited by the embedded layer 105. Also the light is confined in the active layer of the stripe area due to the change in the refractive index.

Though the above-explained structure is based on an n-type GaAs substrate, a similar laser structure can be realized on a p-GaAs substrate by inverting the type of the layer to be grown thereon.

Figure 15:
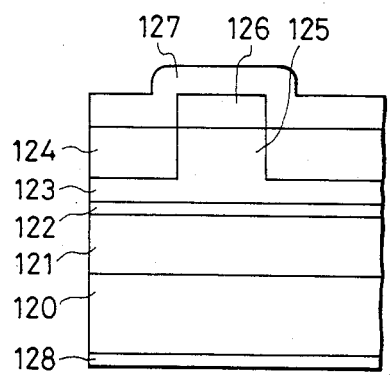

FIG. 15 shows still another embodiment of the stripe area, in which, on an n-GaAs substrate 120, there are formed an n-Al$_{0.3}$Ga$_{0.7}$As clad layer 121 of a thickness of 1.5 μm, a non-doped GaAs active layer 122 of a thickness of 0.1 μm, a p-Al$_{0.3}$Ga$_{0.7}$As clad layer 125 of a thickness of 1.5 μm and a p-GaAs cap layer 126 of a thickness of 0.5 μm. Subsequently the layers 126 and 125 are partially etched off, obtaining the thinner layer 125 as a thinner layer 123 of a thickness in a range of 0.05 to 0.7 μm. Subsequently there are formed an SiO$_2$ insulating layer 124, a p-Au-Zn electrode 127 and an n-AuGe-Ni electrode 128.

Figure 16:
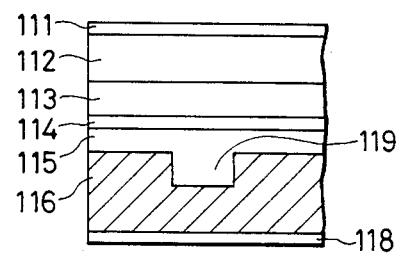

The above-explained ridge-shaped stripe area provides following advantages:

(1) a lower injection current is required for light emission, leading to a lower heat generation and a lower operating temperature;

(2) an improved temperature characteristic, with a lower fluctuation in light output even at a higher temperature; and (3) uniform performance among the neighboring elements The stripe area may also be formed by a groove as schematically shown in FIG. 16, in which a curved groove 119 is formed on a substrate 116 in the form of the stripe area shown in FIG. 6. A semiconductor laser is formed by growing, on said substrate, a clad layer 115, an active layer 114, a clad layer 113 and a cap layer 112, and by forming electrodes 111 and 118. The light generated in the active layer 114 is transmitted, by the confining effect of said groove, along the stripe area shown in FIG. 6. Thus there are obtained plural laser beams, with finite emitting angles, from the end planes of the laser array.

The present invention is not limited to the foregoing embodiments but is modifiable in various manners. For example the materials constituting the semiconductor laser array are not limited to the GaAs/AlGaAs system but can also be composed of InP/InGaAsP system. Also the number of semiconductor laser elements monolithically formed in an array is not limited to two but can be three or larger. In such case the expression "lasers have different light-emitting directions" does not necessarily means that all the emitting directions are mutually different but that there exist at least two different emitting directions.

The present invention covers such modifications within the scope of the appended claims.

What is claimed is:

1. A semiconductor laser array, comprising:
a single substrate; and
a plurality of semiconductor laser elements monolithically formed on said single substrate, wherein each of said semiconductor laser elements comprises:
   a plurality of semiconductor layers comprising a laser active layer;
   first and second end faces formed by said plurality of semiconductor layers and comprising a pair of resonance planes from which laser light is emitted; and
   a plurality of electrodes for supplying current to said plurality of semiconductor layers,
wherein an angle formed between the direction in which light is emitted from said first end face of each of said laser elements and the direction in which light is emitted from said first end face of an arbitrary reference one of said laser elements is different from an angle formed between the direction in which light is emitted from said second end face of said each of said laser elements and the direction in which light is emitted from said second end face of said arbitrary reference one of said laser elements, and wherein at least one of said angles is a non-zero finite angle.

2. A semiconductor laser array according to claim 1, wherein the current injection area of the laser active layer of each semiconductor laser element is limited to a stripe-shaped area, and wherein at least one of the stripe-shaped areas of said laser element has a curved or bent form.

3. A semiconductor laser array according to claim 2, wherein the tangential direction of said stripe shaped area at one of the end faces forms an angle $\theta$ with a normal to said end face to satisfy a condition:

$$\left(90° - \tan^{-1}\frac{L}{d}\right) \leq |\theta| < 1°$$

wherein d is the width of the stripe shaped area parallel to the end face and L is the distance between the resonance planes.

4. A semiconductor laser array according to claim 2, wherein said semiconductor layers of each of said semiconductor laser elements comprise clad layers formed on both sides of said active layer, wherein one of said clad layers is reduced in thickness except in said stripe-shaped area.

5. A semiconductor laser array according to claim 1, wherein at least said one end faces of said semiconductor laser elements form a non-zero finite mutual angle with respect to each other.

6. A semiconductor laser array according to claim 1 wherein said semiconductor laser elements emit mutually parallel light beams from the other end face each other.

7. A semiconductor laser array according to claim 1, wherein said semiconductor layers, including the laser active layer, are grown on said substrate by a molecular beam epitaxy method or an organometallic chemical vapor deposition method.

8. A semiconductor laser array according to claim 1, wherein said laser active layer comprises a multiple quantum well structure.

* * * * *

UNITED STATES PATENT AND TRADEMARK OFFICE
CERTIFICATE OF CORRECTION

PATENT NO. : 4,799,229
DATED : January 17, 1989
INVENTOR(S) : SEIICHI MIYAZAWA, ET AL.   Page 1 of 2

It is certified that error appears in the above-identified patent and that said Letters Patent is hereby corrected as shown below:

COLUMN 1

Line 24, "relative," should read --relative--.
    Line 29, "deflecting scanning" should read --deflecting-scanning--.

COLUMN 2

Line 48, "same" should read --the same--.
    Line 65, "housing" should read --having--.

COLUMN 4

Line 43, "$2a > 3\ \mu m,$" should read --$2a \leq 3\ \mu m,$--.

COLUMN 5

Line 9, "determined" should read --be determined--.
    Line 20, "shape linear" should read --linear shape-- and "curve" should read --curved--.
    Line 21, "shaped." should read --shape.--.
    Line 36, "there-will" should read --there will--.

COLUMN 7

Line 20, "ments" should read --ments.--.
    Line 42, "means" should read --mean--.

UNITED STATES PATENT AND TRADEMARK OFFICE
CERTIFICATE OF CORRECTION

PATENT NO. : 4,799,229
DATED : January 17, 1989
INVENTOR(S) : SEIICHI MIYAZAWA, ET AL.   Page 2 of 2

It is certified that error appears in the above-identified patent and that said Letters Patent is hereby corrected as shown below:

COLUMN 8

```
Line 24, "stripe shaped" should read --stripe-shaped--.
Line 32, "stripe shaped" should read --stripe-shaped--.
Line 45, "claim 1" should read --claim 1,--.
Line 47, "face each" should read --faces with respect
          to each--.
```

Signed and Sealed this

Twenty-seventh Day of February, 1990

Attest:

JEFFREY M. SAMUELS

*Attesting Officer*　　　*Acting Commissioner of Patents and Trademarks*